United States Patent
Shamouilian et al.

(10) Patent No.: US 6,320,736 B1
(45) Date of Patent: Nov. 20, 2001

(54) CHUCK HAVING PRESSURIZED ZONES OF HEAT TRANSFER GAS

(75) Inventors: Shamouil Shamouilian, San Jose; Arnold Kholodenko, San Francisco; Siamak Salimian, Sunnyvale; Hamid Noorbakhsh, Fremont; Efrain Quiles, San Jose, all of CA (US); Dennis S. Grimard, Ann Arbor, MI (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/312,909

(22) Filed: May 17, 1999

(51) Int. Cl.⁷ .................................................. H01H 23/00
(52) U.S. Cl. ........................................... 361/234; 361/115
(58) Field of Search .................................. 361/234, 115; 118/500, 719, 724; 216/67; 156/345; 438/715

(56) References Cited

U.S. PATENT DOCUMENTS

| | | | |
|---|---|---|---|
| 4,432,635 | 2/1984 | Mayer | 355/30 |
| 4,999,320 | * 3/1991 | Douglas | 437/225 |
| 5,267,607 | * 12/1993 | Wada | 165/80.1 |
| 5,350,479 | * 9/1994 | Collins et al. | 156/345 |
| 5,376,213 | 12/1994 | Ueda et al. | 156/345 |
| 5,530,616 | 6/1996 | Kitabayashi et al. | 361/234 |
| 5,542,559 | * 8/1996 | Kawakami et al. | 216/67 |
| 5,547,539 | 8/1996 | Arasawa et al. | 156/626.1 |
| 5,583,736 | 12/1996 | Anderson et al. | |
| 5,609,720 | 3/1997 | Lenz et al. | 156/643.1 |
| 5,667,622 | 9/1997 | Hasegawa et al. | 156/345 |
| 5,671,116 | 9/1997 | Husain | 361/234 |
| 5,748,435 | 5/1998 | Parkhe | 361/234 |
| 5,883,778 | * 3/1999 | Sherstinsky et al. | 361/234 |
| 5,885,469 | 3/1999 | Kholodenko et al. | 216/11 |
| 5,903,428 | 5/1999 | Grimard et al. | |

FOREIGN PATENT DOCUMENTS

| | | |
|---|---|---|
| 0803904A2 | 4/1997 | (EP) . |
| 0803904A3 | 4/1997 | (EP) . |
| 1-251735 | 3/1988 | (JP) . |
| WO9829704 | 7/1998 | (WO) . |

OTHER PUBLICATIONS

U.S. Patent Application etitled, "Electrostatic Chuck with Improved Temperature Control and Puncture Resistance"; filed Jan. 13, 1999; Serial No. 09/231,318; Inventors: Shamouilian, et al.

* cited by examiner

Primary Examiner—Josie Ballato
Assistant Examiner—Sharon Polk
(74) Attorney, Agent, or Firm—Janah and Associates

(57) ABSTRACT

A chuck 28 for holding a substrate 4 comprises a surface 27 capable of receiving the substrate 4, the surface 27 having a gas inlet port 40 and a gas exhaust port 42. A non-sealing protrusion is between the gas inlet port 40 and the gas exhaust port 42. The non-sealing protrusion 44 impedes the flow of heat transfer gas between the gas inlet port 40 and the gas exhaust port 42 without blocking the flow of heat transfer gas. Preferably, a sealing protrusion 46 is provided around the periphery of the chuck 28 to form a substantially gas-tight seal with the substrate 4 to enclose and prevent leakage of heat transfer gas into a surrounding chamber 6.

37 Claims, 5 Drawing Sheets

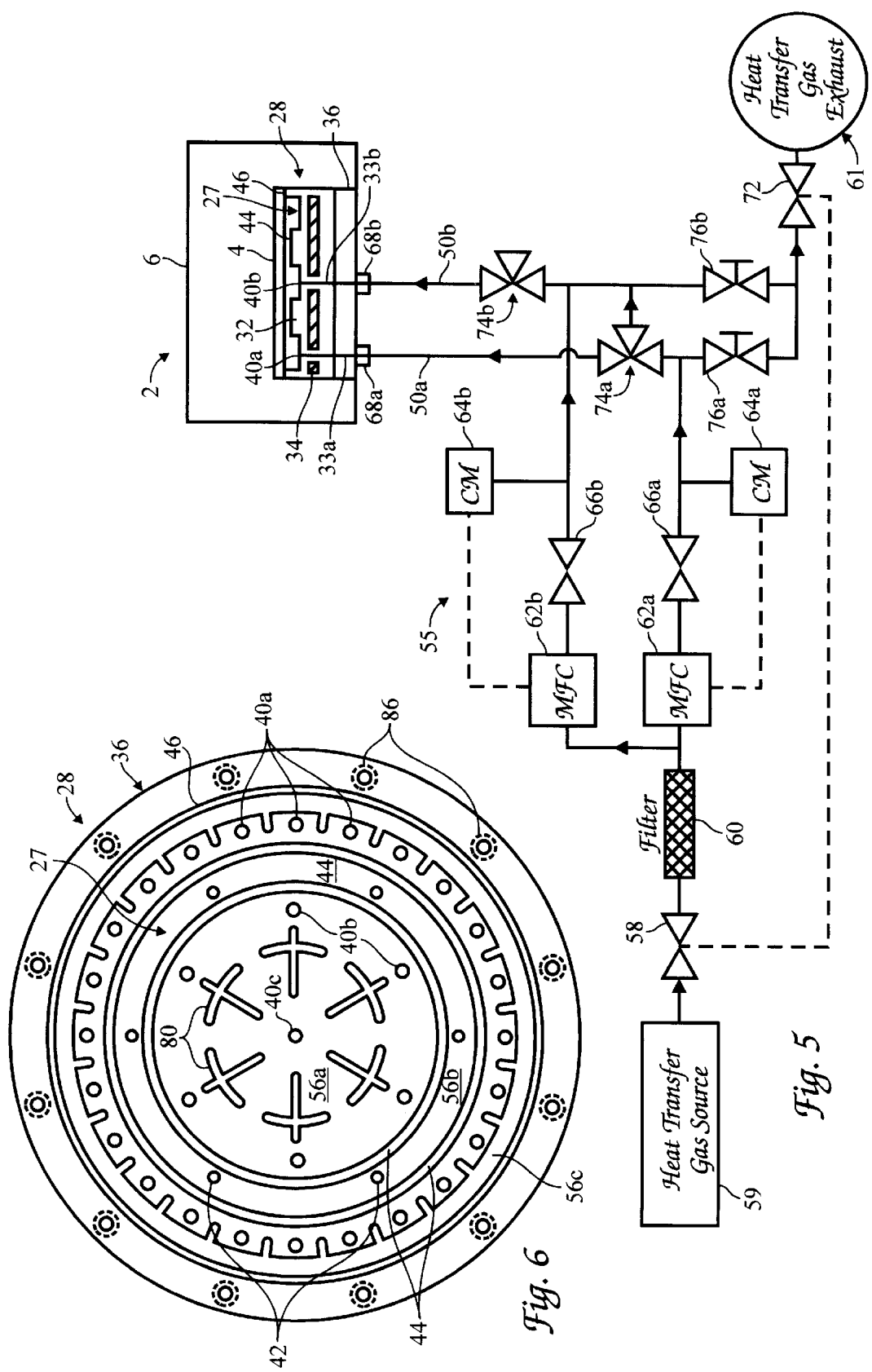

CHUCK HAVING PRESSURIZED ZONES OF HEAT TRANSFER GAS

BACKGROUND

The present invention relates to a chuck for holding a substrate in a chamber.

In semiconductor fabrication, a chuck is used to hold a substrate in a chamber for processing of a layer on the substrate. A vacuum chuck holds a substrate by evacuating gas from below the substrate through a vacuum port; a mechanical chuck has clamps that grip the peripheral edge of the substrate; and an electrostatic chuck holds a substrate by electrostatic attractive forces. While different types of chucks can be used to securely hold a substrate, electrostatic chucks are generally preferred because they press the substrate down more uniformly across a surface of an underlying support, thereby providing more uniform heat transfer rates across the back of the substrate; they allow use of a larger area of the substrate; and they are less prone to form contaminant particles that deposit on the substrate surface. A typical electrostatic chuck comprises an electrode covered by a dielectric, such as ceramic or polymer. When the electrode is electrically charged, electrostatic charges accumulate in the electrode and substrate, and the resultant electrostatic force holds the substrate on the chuck. Once a substrate is securely held on the chuck, process gas is introduced into the chamber and a plasma is formed to process the substrate.

Typically, the temperature of the substrate is controlled by holding helium gas behind the substrate to enhance heat transfer rates across the microscopic gaps at the interface between the back of the substrate and the surface of the chuck.

However, when the microscopic gaps are very small, variations in the heights of the gaps reduce the flow of helium gas to blocked-off regions behind the substrate. This results in an uncontrolled pressure gradient of helium gas across the back of the substrate which can cause variations in heat transfer rates across the substrate. In one solution, commonly assigned U.S. Pat. No. 5,748,435 to Parkhe describes a chuck having a gas inlet and a plurality of gas exhaust ports terminating at its surface. The pressure variation of helium gas across the back of the substrate is reduced because helium gas provided through a gas inlet diffuses toward more than one exhaust port, thereby more uniformly spreading the helium gas across the entire back surface of the substrate. This provides more uniform heat transfer rates across the entire substrate.

However, equalizing the pressure of helium gas across the back of the substrate does not always equalize temperatures across the processing surface of the substrate, especially for processes where different parts of the substrate surface are exposed to different heat loads from the plasma or from the chamber. For example, a substrate is sometimes subjected to non-uniform heat loads which give rise to concentric bands having different temperatures across the processing surface of the substrate. These bands of different temperatures can occur due to the non-uniform coupling of energy from the RF energizing electrode below the substrate to the plasma sheath which results in different rates of bombardment or kinetic energy of the energetic plasma species onto the surface of the substrate. Non-uniform heat loads also arise from varying levels of surface radiation emitted by the chamber components or chamber walls.

Accordingly, it is desirable to reduce the variations in temperature across the substrate surface, especially during processing of the substrate. It is also desirable to control temperatures at different regions across the processing surface of the substrate to compensate for the non-uniform heat loads seen by the substrate during processing. There is also a need for a method for maintaining uniform temperatures across the substrate surface.

SUMMARY

The present invention is useful for holding a substrate and maintaining uniform temperatures across the substrate during processing. In one version, the invention relates to a chuck for holding a substrate in a chamber, the chuck comprising a surface capable of receiving the substrate, the surface comprising a gas inlet port, a gas exhaust port, and a protrusion between the gas inlet port and the gas exhaust port. Preferably, the protrusion serves as a barrier that reduces or impedes the flow of heat transfer gas from the gas inlet port to the gas exhaust port (without blocking the flow of heat transfer gas therebetween) to provide controllable pressures of heat transfer gas in gas pressure zones on either side of the non-sealing protrusion. These zones provide a means for maintaining heat transfer gas at different pressures across the backside of the substrate, thereby compensating for or counteracting variations in heat loads encountered by the substrate to maintain it at uniform temperatures.

The chuck is used in a chamber comprising a gas distributor capable of introducing process gas into the chamber, an exhaust capable of removing process gas from the chamber, and optionally, a gas energizer adapted to energize the process gas in the chamber. A substrate is placed on the chuck, heat transfer gas is provided below the substrate via a gas inlet port, and the heat transfer gas is removed via a gas exhaust port. The flow of heat transfer gas between the gas inlet port and the gas exhaust port is regulated by the shape and size of the non-sealing protrusion between the gas inlet port and the gas exhaust port.

In another version, the present invention relates to an electrostatic chuck comprising a dielectric covering an electrode that is chargeable to electrostatically holding the substrate. The dielectric comprises a surface capable of receiving the substrate, the surface comprising a gas inlet port and a gas exhaust port. A non-sealing protrusion extends around the gas inlet port or the gas exhaust port.

In yet another version, the present invention relates to a chuck for holding a substrate in a chamber, the chuck comprising a surface capable of receiving the substrate, the surface comprising a gas inlet port, a gas exhaust port, and a plurality of mesas between the gas inlet port and the gas exhaust port.

In yet another aspect, the present invention relates to a method of holding a substrate on a chuck, the method comprising the steps of placing a substrate on a chuck, providing heat transfer gas below the substrate via an gas inlet port and removing the heat transfer gas via a gas exhaust port, and maintaining a protrusion between the gas inlet port and the gas exhaust port.

DRAWINGS

These features, aspects, and advantages of the present invention will become better understood with regard to the following description, appended claims, and accompanying drawings which illustrate examples of the invention, where:

FIG. 5 is a schematic view of a gas supply system for providing heat transfer gas to the receiving surface of the chuck;

FIG. 6 is a schematic top view of another embodiment of a chuck according to the present invention.

DESCRIPTION

Figure 1:
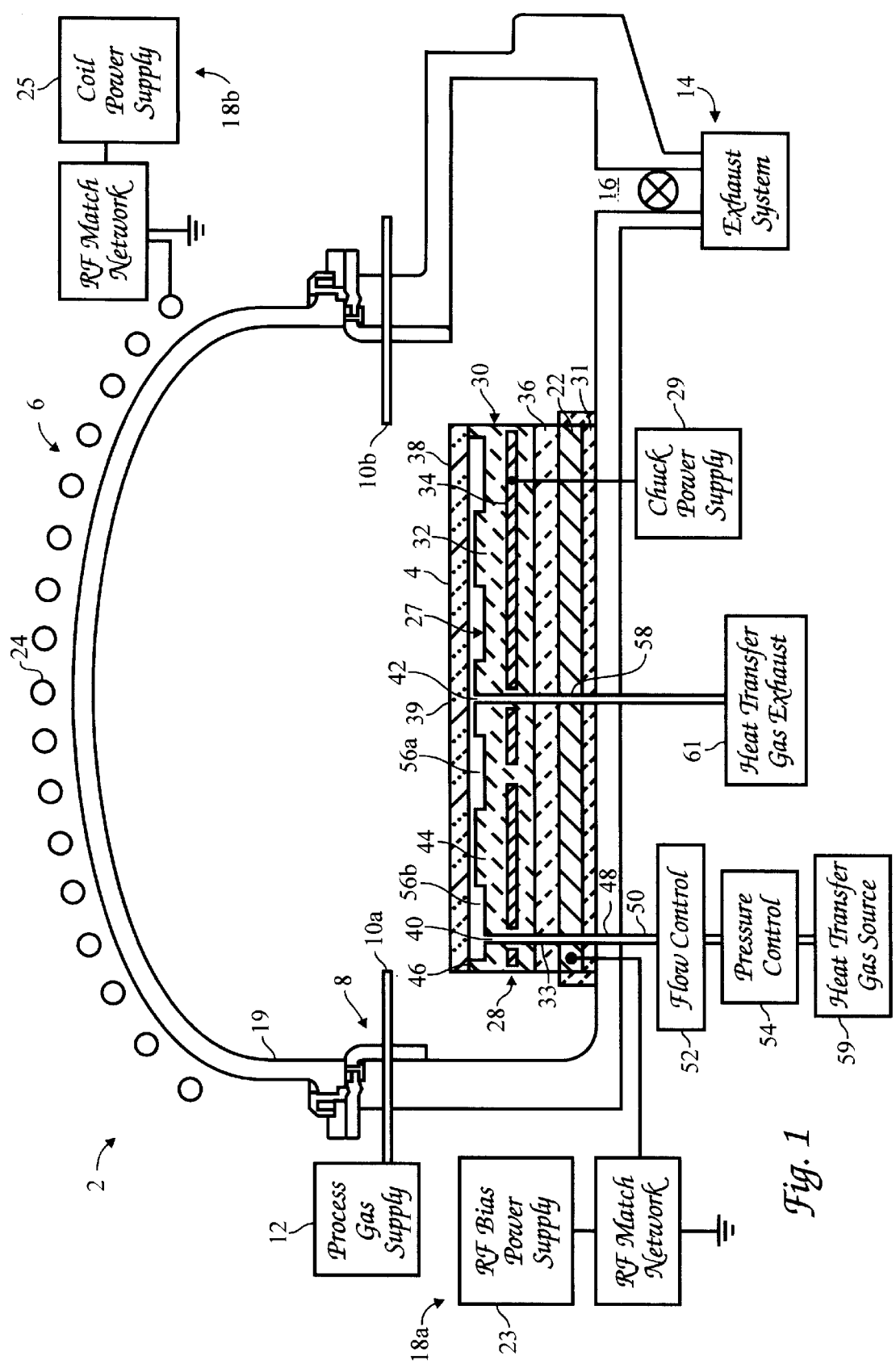
FIG. 1 is a schematic sectional side view of a chamber according to the present invention.

An exemplary apparatus 2 according to the present invention for processing a substrate 4 is illustrated in FIG. 1. The apparatus 2 comprises a chamber 6 having a process gas distributor 8 comprising one or more holes 10a, 10b for introducing process gas from a process gas supply 12 into the chamber 6. The process gas is a gas capable of processing the substrate 4, such as an etching gas, for example, a halogen-containing gas such as chlorine or hydrogen chloride; or a deposition gas, such as a CVD or PVD gas, for example, a gas for depositing dielectric or semiconducting materials. An exhaust system 14 comprising an exhaust conduit 16 is connected to exhaust pumps (not shown) for exhausting spent process gas and gaseous byproducts from the chamber 6. A gas energizer 18a or 18b is provided to capacitively or inductively couple RF energy to the process gas respectively, or transmit microwave energy into the process gas (not shown), to form an energized gas to process the substrate 4. For example, the process gas can be energized capacitively by applying an RF voltage to an electrically conductive portion of a support 22 by a RF bias power supply 23, electrically grounding a wall 19 of the chamber 6, and providing an insulator 31 to electrically isolate the support 22 from the chamber 6. The process gas can also be energized by coupling inductive energy to the process gas via an inductor coil 24 powered by an coil power supply 25. Alternatively, the process gas can be energized by coupling microwave energy to the process gas via a microwave conduit in a remote chamber (not shown).

The substrate 4 is held in the chamber 6 on a receiving surface 27 of an electrostatic chuck 28. Although the present invention is illustrated by way of an electrostatic chuck, other chucks such as vacuum chucks and mechanical chucks, are also encompassed within the scope of the present invention, and the present invention should not be limited in scope to electrostatic chucks. Generally, the electrostatic chuck 28 comprises an electrostatic member 30 comprising a dielectric 32 covering one or more electrodes 34. The dielectric 32 comprises an erosion resistant material capable of withstanding high temperatures and exposure to the energized gas species of the plasma. Suitable dielectric materials depend on the process being conducted on the substrate 4, and include polymers, such as polyimide, and ceramic materials such as aluminum oxide, aluminum nitride, silicon dioxide, titanium oxide, or mixtures thereof. The electrode 34 comprises a plate, layer or mesh of an electrical conductor such as copper, iron, molybdenum, titanium, tungsten, aluminum or alloys thereof. A chuck power supply 29 provides a DC chucking voltage to charge the electrode 34 of the chuck 28 to electrostatically hold the substrate 4. The electrode 34 of the chuck 28 can also be used to energize the plasma in the chamber 6 by applying an RF voltage to the electrode 34 in addition to the DC chucking voltage (not shown).

Optionally, a base 36 is used to secure the electrostatic chuck 28 to the chamber 6. The base 36 can comprise channels (not shown) for circulating fluid to raise or lower the temperature of the chuck 28 and that of the substrate 4 held on the chuck 28. The base 36 can be made from a ceramic, such as aluminum oxide, or a metal, such as zirconium. Preferably, the coefficient of thermal expansion of the base 36 is close to that of the chuck 28 to reduce thermal stresses arising from a mismatch of thermal expansion coefficients.

The receiving surface 27 of the chuck 28 is adapted to have a plurality of zones 56a, 56b that each hold heat transfer gas at a different and equilibrated pressure to provide different heat transfer rates from the back of the substrate 4 at each of the zones 56a, 56b. The multiple zones 56a, 56b serve to counteract the variable heat load that is often provided by the plasma across the processing surface of the substrate 4. For example, when the plasma heats up a peripheral portion 38 of the substrate 4 to a higher temperature than a central portion 39 of the substrate 4, a higher pressure of heat transfer gas is maintained in the peripheral zone 56a below the peripheral portion 38 of the substrate 4 to rapidly dissipate heat from this region; and a lower pressure of heat transfer gas is maintained in the central zone 56b below the central portion 39 of the substrate 4. The multiple zones 56a, 56b hold different pressures of heat transfer gas at the back of the substrate 4, as explained below.

The receiving surface 27 of the chuck 28 comprises at least one gas inlet port 40 to supply heat transfer gas below the substrate 4. The gas inlet port 40 introduces heat transfer gas into the volume of space defined between the back of the substrate 4 and the receiving surface 27 of the chuck 28. The gas inlet port 40 is a termination point of a gas feed conduit 33 that extends through the chuck 28, base 36, and support 22 and is connected to a gas supply feedthrough 48 at the interface of the support 22 and chamber 6, which in turn, is connected via a gas line 50, mass flow controller 52, and pressure controller 54, to a heat transfer gas source 59. The gas inlet port 40 supplies a heat transfer gas such as a non-reactive gas, for example helium or nitrogen, or a halogen-containing gas such as $CF_4$ or $SF_6$, depending on the process being conducted on the substrate 4. The receiving surface 27 of the chuck 28 also comprises at least one gas exhaust port 42 that is coupled via a gas exhaust conduit 58 through the chuck 28, base 36 and support 22 to the heat transfer gas exhaust 61 to exhaust or recycle the heat transfer gas. The heat transfer gas introduced by the gas inlet port 40 travels across the receiving surface 27 to a gas exhaust port 42 via a path of minimum hydrodynamic flow resistance. The flow resistance along a pathway traveled by the heat transfer gas determines the difference in pressure of heat transfer gas between each of the zones 56a, 56b on either end of the pathway.

The hydrodynamic flow resistance between the gas inlet port 40 and exhaust port 42 is controlled by providing a non-sealing protrusion 44 that is around and at least partially encircles either the gas inlet port 40 (not shown) or the gas exhaust port 42 (as shown) to serve as a gas barrier that impedes or reduces the flow of gas between the gas inlet port 40 and the gas exhaust port 42. The non-sealing protrusion 44 does not form an impermeable or gas-tight seal with the overlying substrate 4. Thus, the non-sealing protrusion 44 comprises a height sufficiently large to serve as a physical barrier that impedes the flow of heat transfer gas across the receiving surface 27 of the chuck 28 from the gas inlet port 40 to the exhaust port 42 without blocking the flow of heat transfer gas therebetween. The non-sealing protrusion 44 is shaped as one or more annular ridges, mesas, or plateaus that are raised from the receiving surface 27 of the chuck 28 to divide the receiving surface 27 into a plurality of gas pressure zones 56a, 56b which are located in the recessed regions defined by the non-sealing protrusion 44. The non-sealing protrusions 44 are arranged and distributed to impede the flow of the heat transfer gas across the receiving surface 27 of the chuck 28 to provide controllable pressures of heat transfer gas at each zone 56a, 56b. For example, the non-sealing protrusion 44 can comprise a pattern of raised mesas that are distributed across the chuck or one or more annular rims extending around a gas inlet port or a gas exhaust port.

Figure 4:
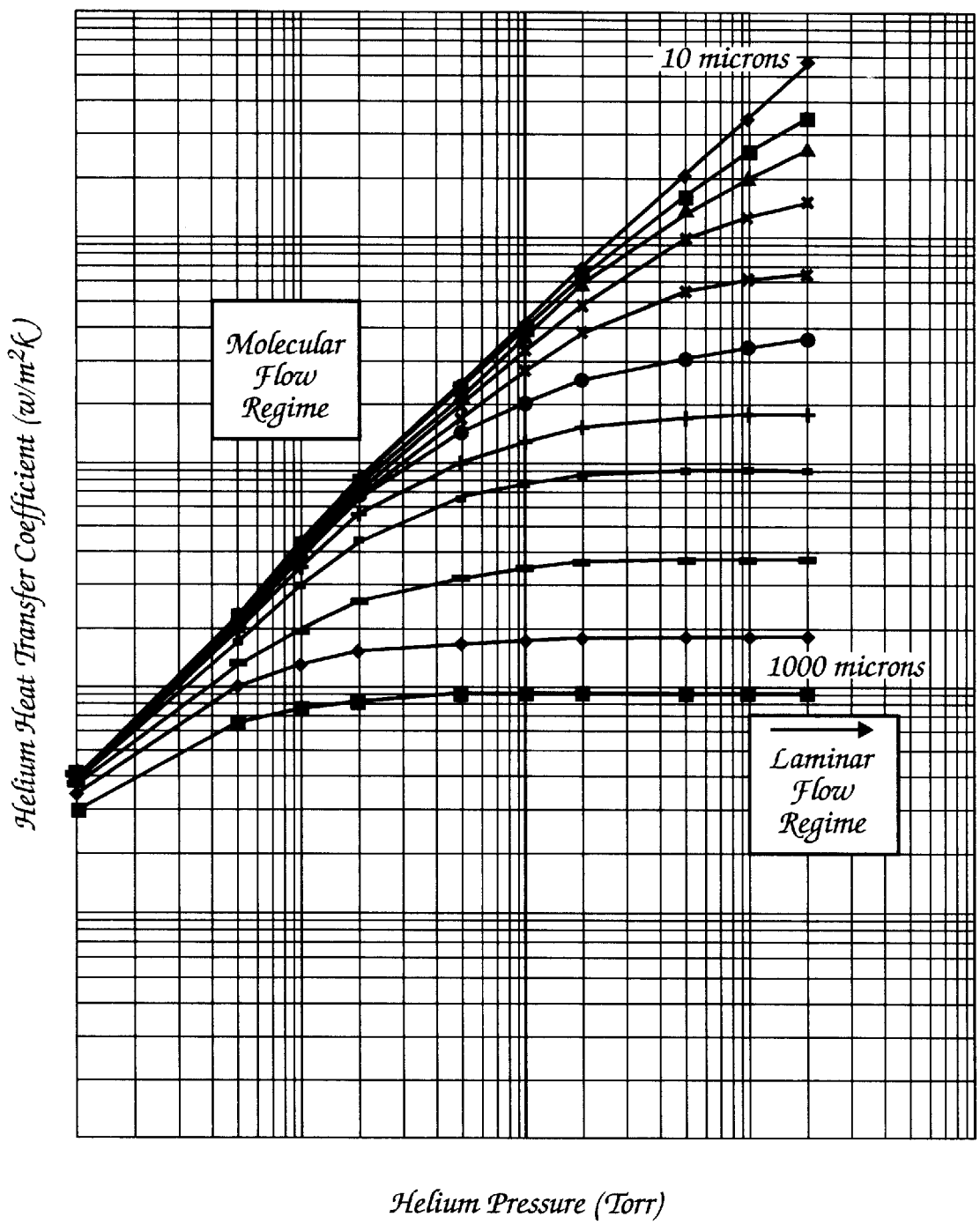
FIG. 4 is a graph of the heat transfer coefficient of helium gas for increasing pressure of gas behind the substrate.

The non-sealing protrusion 44 serves as a gas barrier that regulates the pressure distribution of heat transfer gas across the receiving surface 27 of the chuck 28. The shape of the non-sealing protrusion 44 is selected to obtain the desired hydrodynamic flow resistance across a selected portion of the receiving surface 27. Increased hydrodynamic flow resistance across a portion of the receiving surface 27 results in an increased gas pressure in the zone 56b that is surrounded by a non-sealing protrusion 44, and reduced gas pressure occurs in a zone 56a in which the non-sealing protrusion 44 physically separates the gas inlet port 40 from the gas exhaust port 42. Higher gas pressure results in higher heat transfer rates from the substrate 4 and lower gas pressure results in lower heat transfer rates. For example, FIG. 4 shows the increasing heat transfer coefficient of heat transfer gas such as 5 helium for increasing pressures as computed by a simulation model. FIG. 4 also demonstrates that the pressure of the heat transfer gas must be maintained in the molecular flow regime and not the laminar flow regime to maintain a relational dependence between heat transfer rate and gas pressure. Thus, as long as a molecular flow regime is maintained, as the gas pressure of heat transfer gas increases 10 in the particular zone 56a, 56b, the heat transfer coefficient of the gas also increases to provide higher heat transfer rates from the portion of the back of the substrate 4 above that zone 56a, 56b. Thus, by controlling the pressure of the heat transfer gas in the zones 56a, 56b the rates of removal of heat from the overlying portions of the substrate 4 are also controlled. This is achieved by proper placement of the gas inlet port 40, gas exhaust port 42, and the shape, size, and location of the intervening non-sealing protrusion 44 to provide the desired hydrodynamic flow resistance across the receiving surface 27 of the chuck 28. Thus, in the molecular flow regime, there is less variability of heat transfer coefficient as a function of varying heights of the non-sealing protrusion.

Preferably, a sealing protrusion 46, such as an annular rim extends around the periphery of the chuck 28 below the peripheral portion 38 of the substrate 4 to contact and to form a substantially gas-tight seal with the substrate 4. The sealing protrusion 46 reduces leakage of the heat transfer gas into the chamber 6 by pressing against and forming a seal with the outer peripheral portion 38 of the substrate 4; however, the entire circumference of the peripheral portion 38 is not always completely sealed because of variations in the flatness of the substrate 4 or chuck 28. Preferably, the sealing protrusion 46 comprises a circumferential ledge having a width sized sufficiently large so that the electrostatic attraction force pressing the substrate 4 against the circular ledge forms a substantially gas-tight seal that reduces leakage of heat transfer gas into the chamber 6. The width of the ledge depends upon the sealing efficiency of the materials that make up the ledge. Typically, the sealing protrusion 46 comprises a width of about 1 to about 5 mm. The circumferential ledge has a cylindrical cross-sectional shape that extends around the periphery of the chuck 28 to match the circular shape of the overlying substrate 4. However, for a rectangular substrate (not shown), such as a flat and rectangular display panel, the sealing protrusion 46 would comprise a rectangle or square shaped ledge that matches the shape and size of the rectangular panel. Typically, the sealing protrusion 46 has a height that is higher than the non-sealing protrusion 44 on the receiving surface 27 of the chuck 28. The height of the sealing protrusion 46 depends upon the volume of the space that is desirable immediately below the substrate 4. Also, as the temperature of the substrate 4 increases, a smaller or larger lower volume of space may be desirable. For a substrate 4 processed at a temperature of about 100° C., a suitable height is at least about 10 microns and more preferably about 30 microns, above the recessed portions of the receiving surface 27 of the chuck 28.

Figure 2:
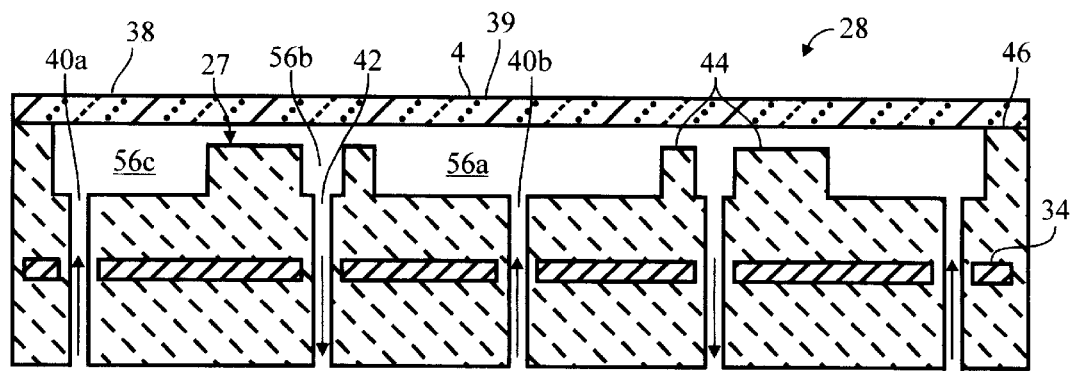
FIG. 2 is a schematic sectional side view of an embodiment of a chuck according to the present invention.
Figure 3:
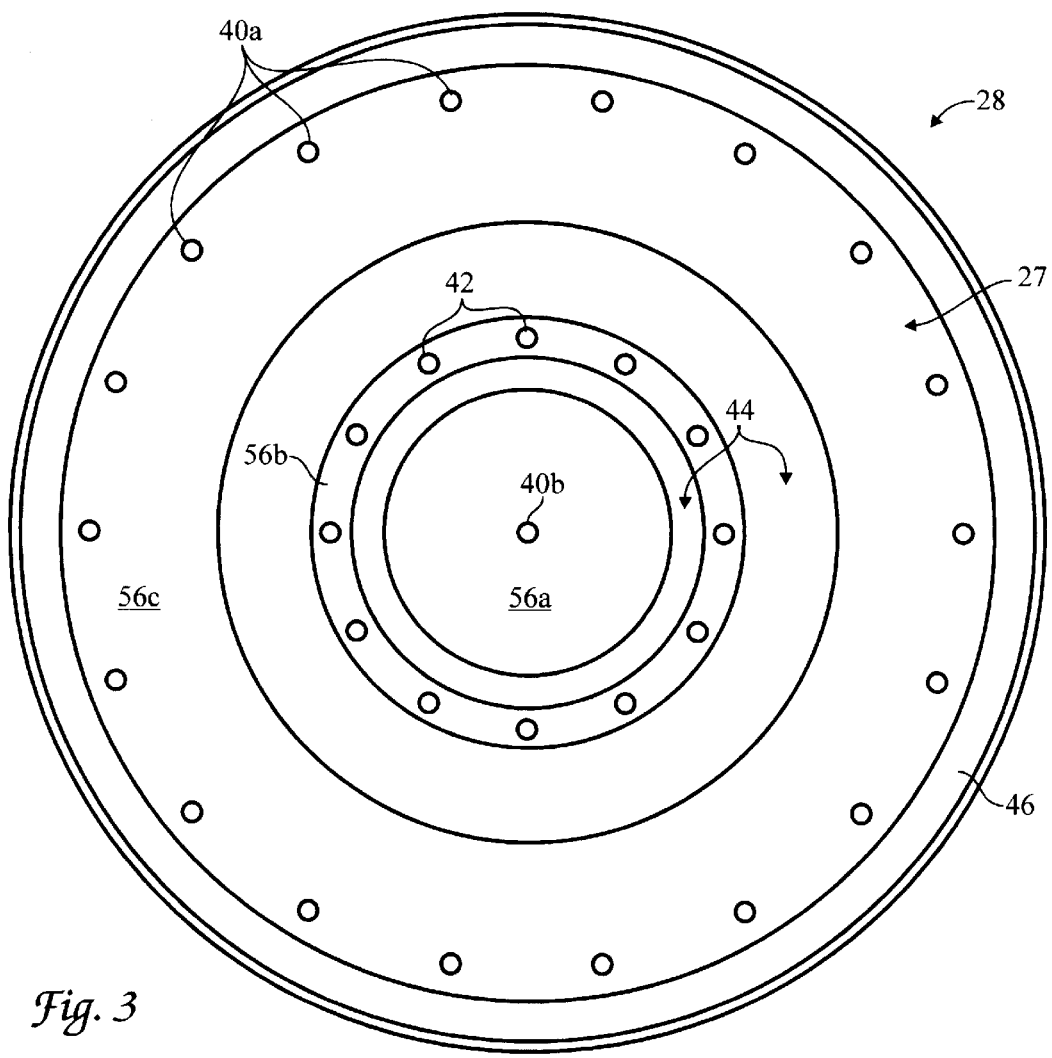
FIG. 3 is a schematic top view of the chuck shown in FIG. 2.

FIGS. 2 and 3 illustrate an implementation according to the principles according to the present invention comprising an electrostatic chuck 28 having multiple gas pressure zones 56a, 56b, 56c in each of which the pressure of heat transfer gas is individually controlled. In this version, the receiving surface 27 comprises a plurality of gas inlet ports 40a, 40b that are spaced apart and distributed across the receiving surface 27. Each gas inlet port 40a, 40b serves as a separate and controllable source of heat transfer gas behind the substrate 4 that provides heat transfer gas at a selected pressure and at a particular location on the receiving surface 27. The gas inlet ports 40a are arranged in a circle about the periphery of the chuck 28, as shown in FIG. 3, to provide higher localized pressures of heat transfer gas in a concentric band extending below the peripheral edge 38 of the substrate 4; and the gas inlet port 40b is a single port located below the central portion 39 of the substrate 4. The receiving surface 27 further comprises a plurality of gas exhaust ports 42 that are distributed in a concentric circle spaced apart from, and in between, the gas inlet ports 40a, 40b. A plurality of non-sealing protrusions 44 are located between the gas inlet ports 40a, 40b and the gas exhaust port 42. The distribution of the gas exhaust ports 42 and gas inlet ports 40a, 40b and one or more of the shape, size and location of the non-sealing protrusions 44 define the shape and size of the gas pressure zones 56a, 56b, 56c below the substrate 4 and the pressure of heat transfer gas in each zone 56a, 56b, 56c. The flow resistance seen by the heat transfer gas as the gas flows from the gas inlet ports 40a, 40b to the gas exhaust port 42 depends on the hydrodynamic fluid resistance created by the non-sealing protrusions 44 in the pathway therebetween. Thus, placement of the gas inlet ports 40a, 40b, the gas exhaust ports 42, and non-sealing protrusions 44 serves as a means for controlling the flow rate or pressure of heat transfer gas across the receiving surface 27. It should also be noted that if the gas inlet ports 40a, 40b and the exhaust ports 42 are located too far away from each other, the distribution of heat transfer gas across the back of the substrate 4 can result in some regions of a zone 56a, 56b, or 56c having an uncontrollably higher or lower pressure of heat transfer gas than other regions within the same zone, which is undesirable.

For example, in the central zone 56a, the flow rate of heat transfer gas between the centrally located gas inlet port 40b and the exhaust ports 42 is higher because it is not impeded by any non-sealing protrusion. This results in a lower pressure of heat transfer gas in the central zone 56a and correspondingly lower heat transfer rates from the substrate 4. The intermediate zone 56b comprises gas exhaust ports 42 that are positioned between the gas inlet ports 40a, 40b. In the intermediate zone 56b, the gas pressure is in between that of the central zone 56a and a peripheral zone 56c. The peripheral zone 56c is on the other side of a non-sealing protrusion 44, which is placed between the gas inlet ports 40a and the gas exhaust ports 42. In this peripheral region, the hydrodynamic gas flow resistance between the gas inlet port 40a and the gas exhaust port 42 is much higher because of the intervening barrier of the non-sealing protrusion 44. The non-sealing protrusion 44 has a large width and a correspondingly large flow resistance is created in the gap between the surface of the non-sealing protrusion 44 and the back of the substrate 4 which results in a higher gas pressure and correspondingly higher heat transfer rates at the peripheral region 56c. Accordingly, this chuck 28 is more suitable for holding a substrate 4 that is subjected to higher thermal loads at its peripheral edge 38 during processing of the substrate 4.

The pressure and flow rates of helium gas can be individually controlled for the gas inlet ports 40a, 40b. FIG. 5 shows a schematic of a gas pressure and flow control system 55 that can be used to regulate the flow of gas into the gas inlet ports 40a, 40b. The flow control system 55 comprises individual gas inlet lines 50a, 50b from a gas source 59 to the gas inlet ports 40a, 40b, respectively. The valve 58 is a normally closed valve that operates as a safety shut-off valve and exhausts gas directly to the heat transfer gas exhaust 61. A filter 60 serves to filter out foreign material and dirt particles from the heat transfer gas provided by the gas source 59. The mass flow controllers 62a, 62b and capacitance manometers 64a, 64b control the flow rate and pressure of the heat transfer gas into each of the gas inlet ports 40a, 40b, respectively. Additional normally closed valves 66a, 66b are also positioned along the gas inlet lines 50a, 50b which pass through gas isolation feeds 68a, 68b to provide gas to the gas feed conduits 33a, 33b. A pair of valves 74a, 74b which have both normally closed positions and normally open positions are also in the inlet gas lines 50a, 50b. Additionally, bypass valves 76a, 76b serve as bypasses for the gas to be directed to the exhaust system 61 through a normally closed valve 72.

Figure 7:
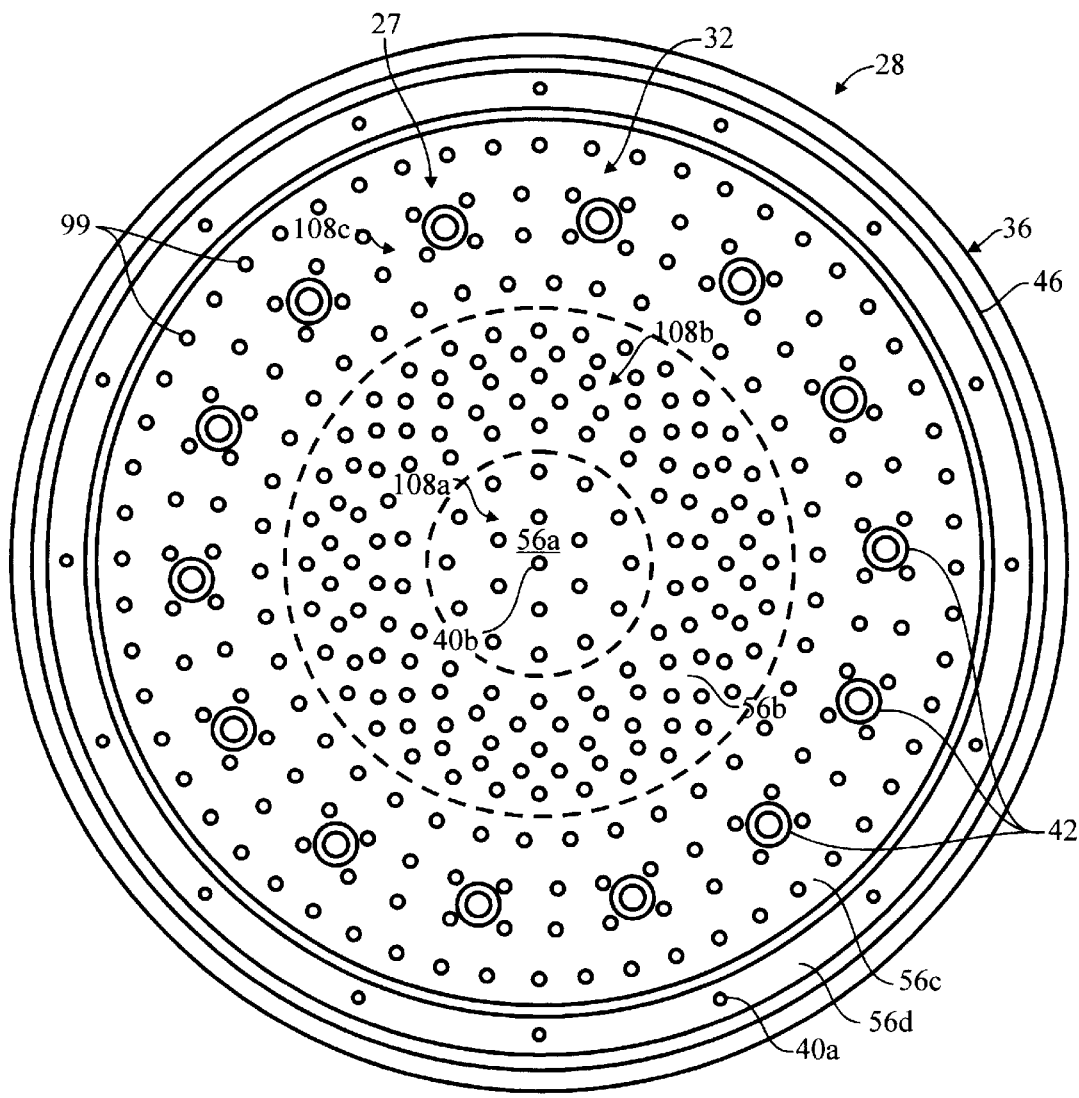
FIG. 7 is a schematic top view of another embodiment of a chuck according to the present invention.

FIGS. 6 and 7 show alternative versions of the chuck 28. For example, FIG. 6 shows a chuck 28 suitable for dielectric etch processes, comprising multiple gas pressure zones 56a, 56b, 56c that are surrounded and enclosed by a sealing protrusion 46 comprising a circular rim that extends around the edge of the chuck 28 to contain the heat transfer gas below the substrate 4. The central zone 56a comprises a pattern of raised T-shape protrusions 80 to support the substrate. A first gas inlet port 40c is at the center of the zone 56a and a ring of second gas inlet ports 40b are along a perimeter of the zone 56a. An intermediate zone 56b comprises a set of gas exhaust ports 42 disposed symmetrically to exhaust the heat transfer gas. A non-sealing protrusion 44 comprising a ring-shaped ledge forms the surface of the zone 56b. A series of gas inlet ports 40a are also positioned along the periphery of the chuck 28. The peripheral holes 86 on the perimeter of the chuck 28 are used to bolt the chuck in the chamber 6.

FIG. 7 shows yet another embodiment in which one or more gas inlet ports 40a are dispersed along the perimeter of the receiving surface 27 of the chuck 28 to provide heat transfer gas to the surface 27, and the heat transfer gas is exhausted by one or more gas exhaust ports 42. A sealing protrusion 46 having a circular rim shape extends around the periphery of the chuck 28 to contain the heat transfer gas to the receiving surface 27 of the chuck 28. In this version, the non-sealing protrusions 44 comprise a plurality of mesas 99 that are distributed between the gas inlet ports 40a, 40b and the gas exhaust ports 42. The shape, size, and spacing of the mesas 99 control the rate of gas diffusion or flow between the mesas 99 and across the receiving surface 27. For example, the mesas 99 can be arranged to provide a lower pressure of gas and lower heat transfer rates in the zone 56c around the gas exhaust ports 42, a higher gas pressure and heat transfer rates in the zone 56a at the center of the surface 27, and an intermediate gas pressure and corresponding intermediate heat transfer rates in the zone 56a at the middle of the chuck 28. In one embodiment, the mesas 99 comprise posts that extend up from the surface 27, the posts having a rectangular or circular cross-sectional shape. The height of the mesas is from about 10 to about 50 microns, and the width (or diameter) of the mesas is from about 500 to about 5000 microns.

Preferably, the mesas 99 are distributed across the surface 27 in a non-uniform pattern. By non-uniform pattern it is meant that one or more of a distance of separation of the mesas 99, a spacing of the mesas 99, a number of mesas 99 per unit area, or a height, shape, or size of the mesas 99 will vary across the surface 27. For example, the spacing or surface density of the mesas 99 can be varied, so that groups of mesas 99 having a common spacing distance form individual arrays 108a, 108b, 108c (which are distinguished by the dashed separator lines in the drawing). Each array 108a, 108b, 108c of mesas 99 serves as a controllable physical barrier that provides a controllable level of flow of heat transfer gas therethrough, thereby providing a predetermined pressure of heat transfer gas in the surrounding zone 56a, 56b, 56c, 56d. Each array 108a, 108b, 108c comprises a different surface density or a different number of mesas 99 per unit area. Preferably, the mesas 99 are distributed in accordance with a predetermined temperature distribution of the substrate 4 to provide higher gas pressures at particular zones and lower gas pressures at other zones across the surface 27 of the chuck 28.

The chuck 28 can also be designed to have a plurality of zones 56 that control heat transfer rates from an overlying substrate 4 to obtain a uniform temperature distribution during a particular type of process being performed on the substrate 4 (not shown). For example, the receiving surface 27 of the chuck 28 can be shaped to provide a topographical pattern of raised non-sealing protrusions 44 that are designed in relation to the temperatures or heat loads across a substrate 4 for a particular set of process conditions in the chamber 6. In this version, the non-sealing protrusions 44 are shaped and located according to an experimentally determined temperature distribution obtained across a substrate 4 in an actual process environment or in a computer modeled simulation of the process environment. For example, the temperature distribution across the processing surface of the substrate 4 can be obtained by placing the substrate 4 in a chamber 6, passing the desired process gas composition into the chamber 6, striking a plasma, optionally, heating or cooling the substrate 4 to the desired average temperature, and mapping the temperature distribution across the substrate 4 by a temperature scanner, such as an infrared detector or optical pyrometer. The shape, size, and location of the non-sealing protrusions are then defined in relation to the bands of different temperatures determined experimentally.

While a uniform pressure of helium gas across the entire backside of the substrate 4 is desirable for many processes, it has been discovered that for some processes, it is desirable to have multiple zones 56 containing different pressures of heat transfer gas. For example, in certain processes, the plasma subjects the substrate 4 to a higher heat load at its peripheral edge 38 than its center 39. In this case, it is desirable to have a higher pressure of heat transfer gas below the peripheral edge 38 of the substrate 4 and a lower pressure below the center 39 of the substrate 4. However, conventional chucks do not provide the ability to hold different pressures of gas at different portions of the back of the substrate 4, and in fact, they are generally designed to minimize pressure differentials across the back of the substrate 4. In contrast, the present chuck 28 provides zones of heat transfer gas having specific predetermined and controllable pressures at different sections of the backside of the substrate 4 to provide better control of the temperatures across the processing surface of the substrate 4.

The topography of the receiving surface 27 of the chuck 28 can be formed by machining, molding or etching a preform to form the desired pattern of non-sealing and sealing protrusions 44, 46, respectively, that each have different heights on the receiving surface 27. For example, a preform (not shown) made from a ceramic material, such as aluminum oxide or silicon dioxide, can be molded in the green or preform stage to form the desired surface topography. The ceramic preform contains an embedded electrode that is chargeable via an electrical connector that extends through the preform. The preform is made by sintering a ceramic powder or other material that is shaped by injection molding or pressure-forming. Preferably, a ceramic powder is formed into a coherent body in a mold shaped to have the desired surface topography by a pressure forming process at a high pressure and temperature. Suitable pressure forming apparatus include autoclaves, platen presses, or isostatic presses. A preferred method of forming a chuck 28 with an embedded electrode 34 uses an isostatic press which applies a more uniform pressure over the entire surface of the chuck. A typical isostatic press comprises a pressure resistant steel chamber (not shown) having a diameter ranging from about 1 to 10 feet which contains a pressurized fluid that is used to apply pressure on an isostatic molding bag. A powdered precursor is prepared comprising a suitable ceramic compound mixed with an organic binder, such as polyvinyl alcohol, which burns off during the sintering step. The ceramic precursor is packed around the embedded electrode in the isostatic molding bag and the bag is inserted in the isostatic press. The fluid in the pressure chamber is pressurized to apply a pressure on the ceramic material. It is desirable to simultaneously remove air trapped in the isostatic molding bag using a vacuum pump to increase the cohesion of the powdered precursor. A ceramic preform with the electrode 34 therein is removed from the molding bag and sintered to form the chuck 28. The gas inlet ports 40 and gas exhaust ports 42 can be subsequently formed by drilling or milling or by inserting suitable inserts in the ceramic mold before the molding process. After the chuck 28 is formed, its surfaces are ground flat by diamond coated grinding wheels to a surface roughness of about 0.007±0.001 mm, which is typically less than about 30 rms.

In another fabrication method, a base 36 is made from a metal to serve as a process electrode 34. The metal base 36 is etched by applying an etch-resistant mask layer on the base 36, forming a pattern of the mask layer by photolithography, and exposing the base 36 to a plasma of a process gas that etches the exposed portions of the base 36 to form the surface topography (not shown). A layer of dielectric 32 such as a ceramic or polymer is adhered over the etched metal base 36.

Alternatively, a flexible laminate comprising a pair of insulator layers surrounding a metal layer that serves as the chuck electrode 34 is adhered over the etched surface of the base 36. In this construction, the flexible laminate is typically made from a polymer layer having a deposited conductor layer, such as a polyimide layer covered by a thin layer of copper. The copper layer is etched through its thickness to form an electrode pattern, which is then covered by a second polymer layer. The resultant flexible laminate is adhered to the etched topographical structure of the base 36 by an adhesive layer so that the flexible laminate conforms to and wraps over both the non-sealing protrusions 44 and sealing protrusions 46 formed in the surface topography.

In yet another method of fabrication, a laminate comprising a dielectric layer supporting a conductor layer is etched via photolithographic methods to form the surface topography on the dielectric or conductor layer (not shown). After the etching process, another dielectric layer is adhered over the conductor layer to form an electrostatic chuck 28 having a desired surface topography. Suitable methods of fabrication are, for example, described in commonly assigned U.S. patent application Ser. No. 08/744,039, entitled "Improved Topographical Structure of an Electrostatic Chuck and Method of Fabricating Same," which is incorporated herein by reference.

Although the present invention has been described in considerable detail with regard to certain preferred versions thereof, other versions are possible. Also, the chuck of the present invention can be used in other chambers, such as physical vapor deposition and chemical vapor deposition chambers. Therefore, the appended claims should not be limited to the description of the preferred versions contained herein.

What is claimed is:

1. A chuck for holding a substrate in a chamber, the chuck comprising a surface capable of receiving the substrate, the surface comprising a gas inlet port to supply a heat transfer gas to the surface, a gas exhaust port to exhaust the heat transfer gas, and at least one protrusion between the gas inlet port and the gas exhaust port, the protrusion comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures.

2. A chuck according to claim 1 wherein the protrusion extends around one or more of the gas inlet port or the gas exhaust port.

3. A chuck according to claim 1 wherein the protrusion defines a recessed region, and wherein at least one of the gas inlet port or the gas exhaust port lies within the recessed region.

4. A chuck according to claim 1 further comprising a sealing protrusion around the periphery of the chuck that forms a substantially gas tight seal with the substrate.

5. A chuck according to claim 1 wherein the protrusion is shaped and sized in relation to a predetermined temperature distribution across the substrate.

6. A chuck according to claim 1 wherein the protrusion comprises an annular ridge.

7. A chuck according to claim 1 wherein the protrusion comprises plurality of mesas.

8. A chuck according to claim 1 comprising a plurality of gas inlet ports.

9. A chuck according to claim 8 comprising a plurality of gas exhaust ports.

10. A chuck according to claim 1 wherein the surface comprises a dielectric, and wherein the dielectric covers an electrode that is chargeable to electrostatically hold the substrate.

11. A chamber comprising:
a gas distributor adapted to provide process gas to the chamber,
an exhaust capable of removing process gas from the chamber,
optionally, a gas energizer adapted to energize the process gas to form a plasma, and
a chuck for holding a substrate in the chamber, the chuck comprising a surface capable of receiving the substrate, the surface comprising a gas inlet port to supply a heat transfer gas to the surface, a gas exhaust port to exhaust the heat transfer gas, and at least one protrusion between the gas inlet port and the gas exhaust port, the protrusion comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures.

12. An electrostatic chuck for holding a substrate, the electrostatic chuck comprising:
a dielectric covering an electrode, the dielectric having a surface capable of receiving the substrate, the surface comprising a gas inlet port to supply a heat transfer gas to the surface and a gas exhaust port to exhaust the heat transfer gas; and
at least one non-sealing protrusion between the gas inlet port and the gas exhaust port, the non-sealing protrusion comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures.

13. An electrostatic chuck according to claim 12 wherein the non-sealing protrusion is shaped and sized in relation to a predetermined temperature distribution across the substrate.

14. An electrostatic chuck according to claim 12 wherein the non-sealing protrusion comprises an annular ridge or a plurality of mesas.

15. An electrostatic chuck according to claim 12 further comprising a sealing protrusion at the periphery of the surface, the sealing protrusion capable of forming a substantially gas-tight seal with the substrate.

16. An electrostatic chuck according to claim 12 further comprising a plurality of gas inlet ports or gas exhaust ports.

17. An electrostatic chuck according to claim 12 wherein the non-sealing protrusion comprises an annular ridge.

18. An electrostatic chuck according to claim 12 wherein the non-sealing protrusion comprises a plurality of mesas.

19. A chamber comprising:
a gas distributor adapted to introduce process gas to the chamber,
an exhaust capable of removing the process gas from the chamber,
optionally, a gas energizer adapted to energize the process gas to process a substrate, and
an electrostatic chuck for holding the substrate, the electrostatic chuck comprising a dielectric covering an electrode, the dielectric having a surface capable of receiving the substrate, the surface comprising a gas inlet port to supply a heat transfer gas to the surface and a gas exhaust port to exhaust the heat transfer gas, and at least one non-sealing protrusion between the gas inlet port and the gas exhaust port, the non-sealing protrusion comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures.

20. A method of holding a substrate on a chuck, the method comprising:
(a) placing a substrate on a surface of the chuck;
(b) providing heat transfer gas to the surface via a gas inlet port and removing the heat transfer gas via a gas exhaust port; and
(c) maintaining at least one protrusion between the gas inlet port and the gas exhaust port, the protrusion comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures.

21. A method according to claim 20 comprising the initial step of shaping and sizing the protrusion in relation to a temperature distribution.

22. A method according to claim 20 comprising maintaining a substantially gas-tight seal at a periphery of the surface.

23. A method according to claim 20 wherein the protrusion comprises an annular ridge or a plurality of mesas.

24. An electrostatic chuck for holding a substrate, the electrostatic chuck comprising a dielectric covering an electrode, the electrode being chargeable to electrostatically hold the substrate, and the dielectric having a surface comprising a plurality of gas inlet and exhaust ports, and at least one non-sealing protrusion between the gas inlet ports and the gas exhaust ports, the non-sealing protrusion comprising a height above the surface that is sufficiently large to impede the flow of heat transfer gas from the gas inlet ports to the gas exhaust ports to form a plurality of zones across the surface, the zones adapted to hold heat transfer gas at different pressures, and a sealing protrusion about the periphery of the surface, the sealing protrusion capable of forming a substantially gas-tight seal with the substrate.

25. An electrostatic chuck according to claim 24 wherein the non-sealing protrusion is around a gas inlet port or a gas exhaust port.

26. An electrostatic chuck according to claim 24 wherein the the non-sealing protrusion is shaped and sized in relation to a predetermined temperature distribution across the substrate.

27. A chuck for holding a substrate in a chamber, the chuck comprising a surface capable of receiving the substrate, the surface comprising a gas inlet port, a gas exhaust port, a plurality of mesas between the gas inlet port and the gas exhaust port, the mesas comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures, and a sealing protrusion about the periphery of the surface, the sealing protrusion capable of forming a substantially gas-tight seal with the substrate.

28. A chuck according to claim 27 wherein the mesas are distributed across the surface in a non-uniform pattern.

29. A chuck according to claim 27 wherein the mesas are distributed in a plurality of arrays across the surface, each array having a different number of mesas per unit area.

30. A chuck according to claim 27 wherein the mesas are distributed across the surface such that the spacing between the mesas varies.

31. A chuck according to claim 27 wherein the mesas are distributed in accordance with a predetermined temperature distribution across the substrate.

32. A chuck according to claim 27 wherein the surface comprises a dielectric, and wherein the dielectric covers an electrode that is chargeable to electrostatically hold the substrate.

33. A chamber comprising:

a gas distributor capable of introducing process gas into the chamber, an exhaust capable of removing process gas from the chamber, optionally, a gas energizer adapted to energize the process gas to process a substrate, and a chuck for holding the substrate in the chamber, the chuck comprising a surface capable of receiving the substrate, the surface comprising a gas inlet port, a gas exhaust port, a plurality of mesas between the gas inlet port and the gas exhaust port, the mesas comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures, and a sealing protrusion about the periphery of the surface, the sealing protrusion capable of forming a substantially gas-tight seal with the substrate.

34. A method of holding a substrate on an electrostatic chuck comprising an electrode and a surface having a gas inlet port and a gas exhaust port, the method comprising:

(a) placing a substrate on the surface of the electrostatic chuck;

(b) electrostatically holding the substrate on the surface by charging the electrode;

(c) providing heat transfer gas to the surface via the gas inlet port and removing the heat transfer gas via the gas exhaust port; and (d) maintaining at least one non-sealing protrusion between the gas inlet port or the gas exhaust port, the non-sealing protrusion comprising a height above the surface that is sufficiently large to impede the flow of heat transfer gas from the gas inlet port to the gas exhaust port without blocking the flow of heat transfer gas therebetween to form a plurality of zones across the surface, the zones adapted to hold heat transfer gas at different pressures.

35. A method according to claim 34 comprising the initial step of shaping and sizing the protrusion in relation to a temperature distribution across the substrate.

36. A method according to claim 34 comprising maintaining a substantially gas-tight seal at a periphery of the surface.

37. A method according to claim 34 wherein the protrusion comprises an annular ridge or a plurality of mesas.

* * * * *